United States Patent [19]
Gould

[11] Patent Number: 5,888,891
[45] Date of Patent: Mar. 30, 1999

[54] PROCESS FOR MANUFACTURING A SCHOTTKY DIODE WITH ENHANCED BARRIER HEIGHT AND HIGH THERMAL STABILITY

[75] Inventor: Herbert J. Gould, Sherman Oaks, Calif.

[73] Assignee: International Rectifier Corporation, El Segundo, Calif.

[21] Appl. No.: 701,847

[22] Filed: Aug. 23, 1996

[51] Int. Cl.⁶ .......................... H01L 21/34; H01L 29/872
[52] U.S. Cl. .......................... 438/575; 438/581; 438/582
[58] Field of Search .................................. 438/581, 575, 438/576, 582

[56] References Cited

U.S. PATENT DOCUMENTS

| | | | |
|---|---|---|---|
| 4,206,540 | 6/1980 | Gould | 438/570 |
| 4,398,344 | 8/1983 | Gould | 438/121 |
| 4,408,216 | 10/1983 | Gould | 257/486 |
| 4,946,803 | 8/1990 | Ellwanger | 438/581 |

OTHER PUBLICATIONS

J.L. Freeouf, "Silicide interface stoichiometry[a)]", J. Vac. Sci. Technol., vol. 18, No. 3, Apr. 1981, pp. 910–916.

R.W. Bower, et al., "Formation Kinetics and Structure of $Pd_2Si$ Films on Si*", State Electronics, 1973, vol. 16, pp. 1461–1471.

*Primary Examiner*—John F. Niebling
*Assistant Examiner*—Ha Tran Nguyen
*Attorney, Agent, or Firm*—Ostrolenk, Faber, Gerb & Soffen, LLP

[57] ABSTRACT

A schottky diode is formed of a sintered palladium platinum silicide in contact with a lightly doped silicon surface in which the platinum and palladium are present in a ratio of about one part to about 10 parts respectively, by weight.

24 Claims, 2 Drawing Sheets

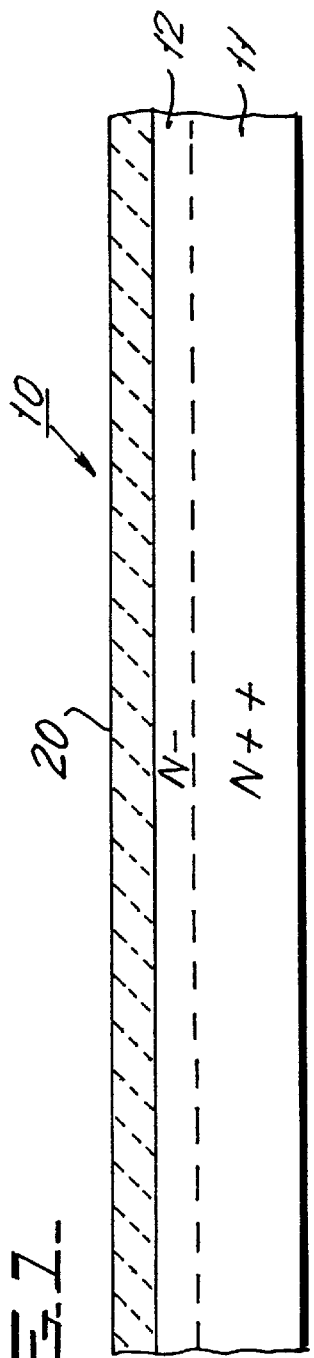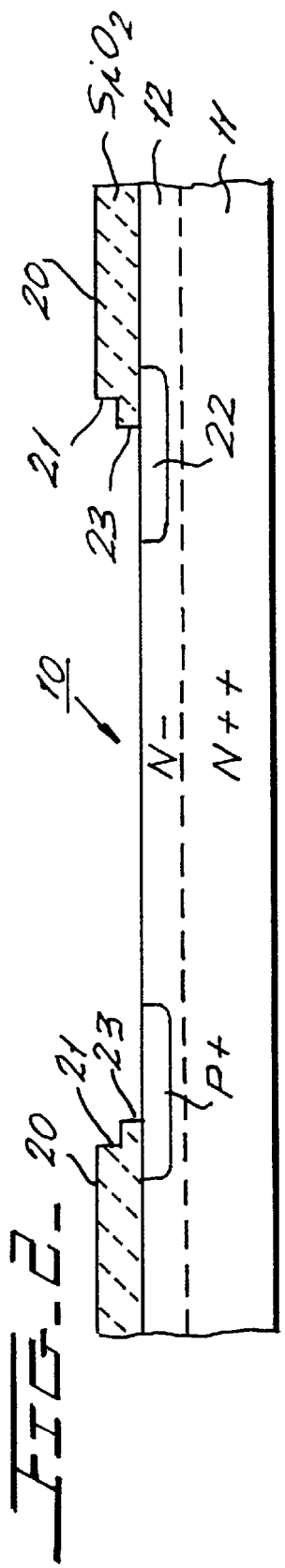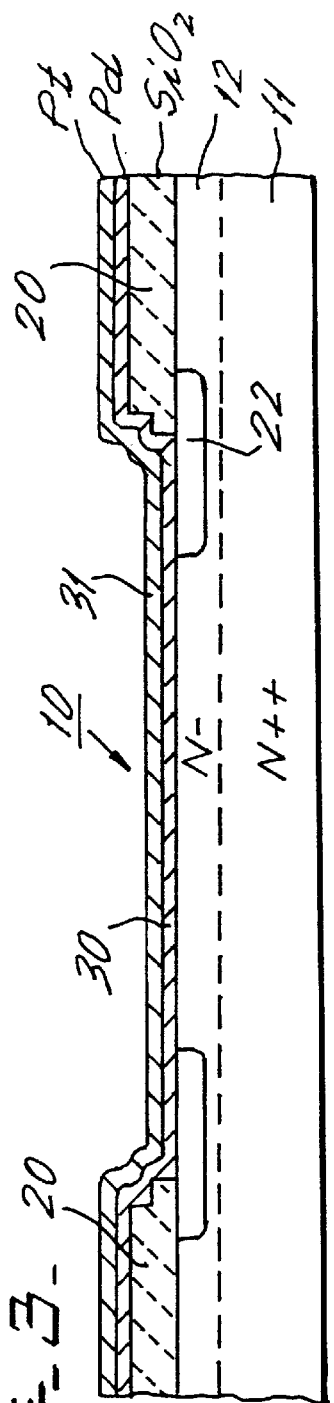

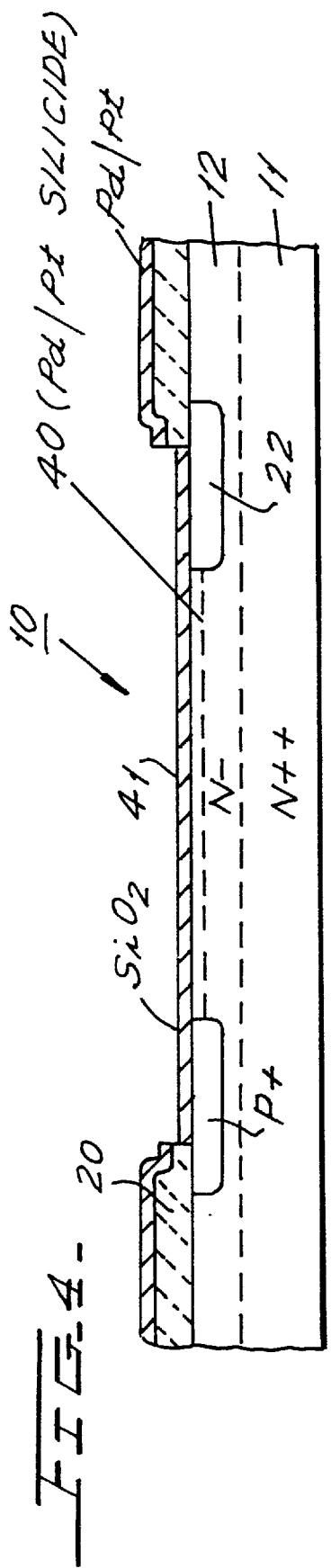
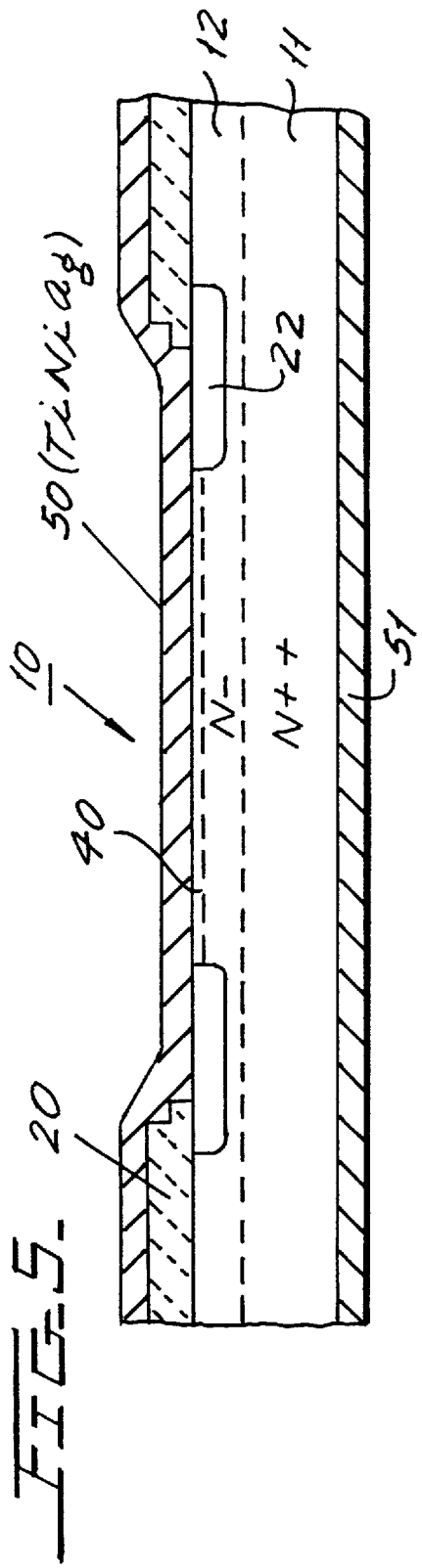

PROCESS FOR MANUFACTURING A SCHOTTKY DIODE WITH ENHANCED BARRIER HEIGHT AND HIGH THERMAL STABILITY

FIELD OF THE INVENTION

This invention relates to schottky diodes and to a process for their manufacture.

BACKGROUND OF THE INVENTION

Schottky diodes and processes for their manufacture are well known. For example, U.S. Pat. Nos. 4,206,540, 4,398,344 and 4,408,216, in the name of Herbert Gould, describe processes for the manufacture of a schottky diode in which a palladium platinum silicide is used for the schottky barrier to a silicon substrate.

An important characteristic of a schottky diode is a low hot reverse leakage current. Thus, leakage reverse current at, for example, 125° C. may exceed about 10 milliamperes per square millimeter of silicon area. A lower hot reverse leakage current would be desirable, for example, 5 milliamperes per square millimeter.

Another important characteristic of a schottky diode is its turn-on voltage, sometimes called its knee voltage. This voltage should be as low as possible. However, the knee voltage is usually increased when the hot reverse leakage current is reduced. It would be desirable to provide a process in which the hot reverse leakage current can be reduced without an excessive increase in knee voltage.

In the manufacture of schottky diodes, a number of mask steps are used, especially to form a guard ring diffusion. The present invention provides a novel process in which the masks are self aligning.

BRIEF DESCRIPTION OF THE INVENTION

In accordance with the present invention, an improved schottky diode is formed by a process in which a palladium platinum silicide barrier is formed by the deposition of about 10 part of palladium to about 1 part of platinum followed by the sintering of the platinum and palladium into the silicon. In a preferred embodiment, 500 Å of palladium, followed by 50 Å of platinum was deposited and then sintered into the silicon. The resulting schottky device had a hot reverse leakage current of about 375 microamperes/m.m. SQ and a knee voltage of about 0.46 volts.

The ratio of about 10 parts palladium to about 1 part platinum is significant, and 300 Å of palladium and 30 Å of platinum produces the same result. This ratio can then be adjusted as desired to obtain any desired trade off of hot reverse current ($I_R$) versus knee voltage.

In accordance with the invention, any ratio of from about 15 to 1, to about 5 to 1 will produce an improved schottky diode, in accordance with the invention.

A major advantage of the invention is that the junction is buried and thus is less sensitive to the vagaries of surface chemistry. Thus, the process is very reproducible in a production environment.

The invention unobviously, and for the first time, permits the selection of hot leakage as a tradeoff against knee voltage (and subsequent $V_{ON}$). Thus, schottky diodes can be produced with far lower hot leakage than devices now available. Virtually any other device characteristic can be met with variable barrier characteristics.

As an example of the advantages of the invention, a standard 45 volt molybdenum/silicon barrier schottky will have a hot leakage of about 4.8 MA/m.m. SQ at 125° C. Using the process of the aforementioned U.S. Pat. No. 4,408,216, the hot leakage will be about 720 uA/m.m. SQ for the same conditions. However, since both processes are both subject to very sensitive surface chemistries, much higher leakages can result. Note that hot leakage is never lower than its target value; it is either correct or is higher. Thus, a specification value of 2.15 MA is used for devices in which the leakage should theoretically be only 725 uA. With the process of the invention, the surface chemistry problem is solved, and the above theoretical specification can be consistently met with pure Pd2Si:Si.

The selectability of barrier height in accordance with the invention permits the use of a higher barrier and a larger, thicker die and still meet current specifications. The use of a thicker die, in turn, permits the use of larger, thicker production wafers (5 or 6 inch diameter wafers) in place of the presently used 4 inch wafer for existing processes. Thus, the new process provides an escape from the present need for small die area (to make the specified hot leakage) while a die which is smaller in area or thicker will not make the desired $V_{ON}$.

BRIEF DESCRIPTION OF THE DRAWINGS

FIG. 1 is a cross-section through a portion of a silicon chip which is to be processed in accordance with the present invention.

FIG. 2 shows the chip of FIG. 1 after the growth of a field oxide and the diffusion of a guard ring.

FIG. 3 shows the chip of FIG. 2 after the deposition of a palladium and a platinum layer.

FIG. 4 shows the chip of FIG. 3 after the heating of the chip to form a non-stoichiometric Pd/Pt silicide interface, silicide schottky barrier and after the formation of a very thin oxide layer atop the silicide surface.

FIG. 5 shows the chip of FIG. 4 after the removal of the oxide layer and the formation of contact layers.

DETAILED DESCRIPTION OF THE DRAWINGS

Referring first to FIG. 1, there is shown, in cross-section, a chip 10 which can be a thin monocrystalline silicon chip which is part of a larger wafer in which a plurality of identical chips can be simultaneously processed. Chip 10 has an $N^+$ body 11 and an $N^-$ epitaxially deposited layer 12 thereon. As a typical example, for a schottky diode with a reverse blocking voltage rating of 45 volts, the wafer 10 is preferably of [1-1-1] silicon having an arsenic doped $N^+$ body 11 which is about 300 microns thick and has a resistivity of about 0.002 ohm centimeters, and an $N^-$ phosphorus doped epitaxial layer 12 which is about 5 to 6 microns thick and has a resistivity of about 0.9 ohm centimeters. The [1-1-1] orientation is preferred because the solid state epitaxy that results will be a single crystal film. Other orientations have been found to produce a polycrystalline film with leaky grain boundaries.

In a first process step, a field oxide 20 is grown atop the $N^-$ layer 12 to a thickness of about 3000 Å. Thereafter, in a first mask step, a polygonal ring 21 is etched in the oxide 20 to expose the silicon surface.

Boron is then implanted into the window 21 and the boron P type implant is diffused to a depth of about 1.5 microns and a sheet resistance of about 40 ohms per square.

A new layer of oxide is grown over the silicon surface in window 21 during the $P^+$ guard ring 22 diffusion. This oxide is etched in a second mask step to expose the schottky window 23 also shown in FIG. 2. After the schottky window 23 is formed, a silicon etch is used to etch about 1000 Å of the exposed silicon surface.

Thereafter, and as shown in FIG. 3, a layer 30 of palladium is E-beam deposited in vacuum to a thickness of about 500 Å. Next, and preferably without breaking vacuum, a layer of platinum 31 is E-beam deposited atop palladium layer 30 to a thickness of about 50 Å. While a ratio of palladium to platinum of about 10 to 1 is preferred, the ratio could be from about 5 to 1 to about 15 to 1.

The chip 10 or its wafer is then placed in a diffusion furnace filled with a suitable forming gas and is heated to about 500° C. for about 30 minutes to form the palladium/platinum silicide 40 shown in FIG. 4. Silicide 40 is a solid phase epitaxy Pd/Pt silicide layer. Silicide 40 forms a non-stoichiometric silicide interface to silicon 12. Note that the silicide 40 will be immune to subsequent assembly operation bonding temperatures, such as die attach, which are much less than 500° C.

When the chip 10 is removed from the furnace, a very thin silicon dioxide layer 41 will be atop the upper surface of the chip. Using this thin layer 41 as a mask, the unreacted palladium and platinum atop the field oxide 20 is removed by a suitable etch. In some cases, the Pd/Pt metal can be physically pulled off. The underlying silicide is protected from the etch by oxide 41. Thus, the process is self-aligning.

As next shown in FIG. 5, oxide layer 41 is removed as by an etch in dilute HF (100 parts water to 1 part HF) for about 30 seconds.

The wafer (and chip 10) is then rinsed and dried and a contact 50 is applied to the upper surface of chip 10 and to the silicide 41. Contact 50 may be a tri-metal consisting of a bottom layer of titanium, 1000 Å thick, a second layer of nickel, 3000 Å thick and an uppermost silver layer 35,000 Å thick. A conventional photoresist strip, metal etch sequence and photoresist strip completes the front surface of the wafer. A suitable bottom contact 51 is also formed.

The resulting device of FIG. 5 is a schottky diode in which the palladium/platinum silicide forms the schottky barrier, as contrasted to the conventional high work function metal contact. The new device is very stable through assembly and has a very low hot (125° C.) reverse leakage current of about 375 microamperes per m.m. SQ with a knee voltage of 0.42 volts.

By contrast, molybdenum on silicon schottky diodes have a 4.8 MA per m.m SQ hot reverse current; and palladium silicon on silicon has a hot reverse current of 1.9 uA per m.m. SQ. In another prior art process using a silicide and molybdenum barrier, the hot reverse current is 720 uA per m.m. SQ.

A further advantage of the new process described is that the process is self-aligning in that no photoresist step is needed to remove unreacted palladium/platinum from atop the field oxide.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for the manufacture of a schottky diode comprising the steps of depositing a layer of palladium atop the surface of a silicon body to a first thickness; depositing a layer of platinum atop said layer of palladium to a thickness of from about 1/15th to about 1/5th of said first thickness; sintering said palladium and platinum layers with the silicon at the surface of said silicon to form a schottky barrier to said silicon body; and thereafter forming a contact metal to the upper surface of said sintered palladium platinum and silicon schottky barrier.

2. The process of claim 1 wherein said palladium layer is about 500 Å thick and said platinum layer is about 50 Å thick.

3. The process of claim 2 wherein said platinum and palladium layers are sintered at about 500° C. for about 30 minutes.

4. The process of claim 2 wherein said silicon body includes a lightly doped N epitaxially formed layer atop a more heavily doped body portion.

5. The process of claim 4 which includes the step of diffusing a P type guard ring into said N⁻ layer; said guard ring enclosing the surface area of said sintered barrier layer and being connected to said contact.

6. The process of claim 2 wherein said contact metal is a tri-layer of titanium, nickel and silver.

7. The process of claim 1 wherein said platinum and palladium layers are sintered at about 500° C. for about 30 minutes.

8. The process of claim 1 wherein said silicon body includes a lightly doped N⁻ epitaxially formed layer atop a more heavily doped body portion.

9. The process of claim 8 wherein said palladium layer is about 500 Å thick and said platinum layer is about 50 Å thick.

10. The process of claim 9 wherein said platinum and palladium layers are sintered at about 500° C. for about 30 minutes.

11. The process of claim 8 which includes the step of diffusing a P type guard ring into said N⁻ layer; said guard ring enclosing the surface area of said sintered barrier layer and being connected to said contact.

12. The process of claim 1 wherein said contact metal is a tri-layer of titanium, nickel and silver.

13. The process of claim 12 which includes the step of diffusing a P type guard ring into an N⁻ layer that comprises said silicon body; said guard ring enclosing the surface area of said sintered barrier layer and being connected to said contact.

14. The process of claim 13 wherein said palladium layer is about 500 Å thick and said platinum layer is about 50 Å thick.

15. The process of claim 14 wherein said platinum and palladium layers are sintered at about 500° C. for about 30 minutes.

16. A process of manufacture of a schottky diode having a low hot reverse leakage current and a low knee voltage; said process comprising: depositing a field oxide atop a surface of an N⁻ epitaxially deposited silicon layer; opening an annular window in said field oxide and forming a P⁺ guard ring in said silicon layer in the area of said annular window; removing said field oxide which is contained within the area enclosed by said annular window; depositing a layer of palladium of a first thickness atop the surface of said silicon layer and the field oxide disposed exteriorly of said annular window; depositing a layer of platinum which is about 1/10th the thickness of said palladium layer atop said palladium layer; heating said palladium layer, said platinum layer and said silicon contacted thereby to sinter said layers and said silicon and forming a silicide schottky barrier to the silicon beneath the silicide; removing the unreacted palladium and platinum from atop said field oxide and connecting a contact layer to said silicide and to said guard ring.

17. The process of claim 16 wherein said palladium layer is about 500Å thick and said platinum layer is about 50 Å thick.

18. The process of claim 17 wherein said platinum and palladium layers are sintered at about 500° C. for about 30 minutes.

19. The process of claim 18 wherein said contact layer is a tri-layer of titanium, nickel and silver.

20. The process of claim 17 wherein said contact layer is a tri-layer of titanium, nickel and silver.

21. The process of claim 17 wherein said platinum and palladium layers are sintered at about 500° C. for about 30 minutes.

22. The process of claim 17 wherein said contact layer is a tri-layer of titanium, nickel and silver.

23. The process of claim 16 wherein said platinum and palladium layers are sintered at about 500° C. for about 30 minutes.

24. The process of claim 16 wherein said contact layer is a tri-layer of titanium, nickel and silver.

* * * * *